US011121782B2

(12) United States Patent
Zang et al.

(10) Patent No.: US 11,121,782 B2
(45) Date of Patent: Sep. 14, 2021

(54) DIAGNOSING CABLE FAULTS WITHIN A NETWORK

(71) Applicant: Microchip Technology Incorporated, Chandler, AZ (US)

(72) Inventors: John Junling Zang, Guangdong (CN); Dixon Chen, Guangdong (CN); Hongming An, San Diego, CA (US); Jiachi Yu, Guangdong (CN); Kevin Yang, Guangdong (CN); Yanzi Xu, Guangdong (CN); Henry Liang, Guangdong (CN)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/588,714

(22) Filed: Sep. 30, 2019

(65) Prior Publication Data

US 2021/0058168 A1 Feb. 25, 2021

(30) Foreign Application Priority Data

Aug. 23, 2019 (CN) .......................... 201910784058.2

(51) Int. Cl.
*H04B 17/17* (2015.01)
*H04B 17/29* (2015.01)
*H04L 29/08* (2006.01)
*H04L 12/40* (2006.01)

(52) U.S. Cl.
CPC ............. *H04B 17/17* (2015.01); *H04B 17/29* (2015.01); *H04L 12/40* (2013.01); *H04L 69/323* (2013.01)

(58) Field of Classification Search
CPC ........ H04B 17/15; H04B 17/17; H04B 17/29; H04L 12/40; H04L 69/323
USPC ......................................................... 375/224
See application file for complete search history.

(56) References Cited

U.S. PATENT DOCUMENTS

| 4,739,276 | A | * | 4/1988 | Graube | .................. | G01R 31/11 |
| | | | | | | 324/534 |
| 4,970,466 | A | | 11/1990 | Bolles et al. | | |
| 5,134,377 | A | * | 7/1992 | Reddy, III | ............ | G01M 3/165 |
| | | | | | | 324/533 |
| 5,305,459 | A | | 4/1994 | Rydel | | |
| 5,357,145 | A | | 10/1994 | Segaram | | |

(Continued)

FOREIGN PATENT DOCUMENTS

| CN | 101127928 A | 2/2008 |
| EP | 0620664 | 10/1994 |

(Continued)

OTHER PUBLICATIONS

International Search Report from International Application No. PCT/US2020/070347, dated Nov. 16, 2020, 4 pages.

(Continued)

*Primary Examiner* — Kevin M Burd
(74) *Attorney, Agent, or Firm* — TraskBritt

(57) ABSTRACT

Various embodiments relate to detecting a cable fault within a 10SPE network. A method may include transmitting a pulse signal to a cable of a shared bus from a node, and observing a signal received at the node in response to the pulse signal. The method may also include determining a fault condition of the cable based on the pulse signal and on an amplitude of each sample of a number of samples of the one or more observed signals.

18 Claims, 9 Drawing Sheets

(56) References Cited

U.S. PATENT DOCUMENTS

| | | | |
|---|---|---|---|
| 5,381,348 | A | 1/1995 | Ernst et al. |
| 5,784,573 | A | 7/1998 | Szczepanek et al. |
| 5,859,554 | A | 1/1999 | Higashisaka et al. |
| 5,892,893 | A | 4/1999 | Hanf et al. |
| 6,029,202 | A | 2/2000 | Frazier et al. |
| 6,115,831 | A | 9/2000 | Hanf et al. |
| 6,215,816 | B1 | 4/2001 | Gillespie et al. |
| 6,459,739 | B1 | 10/2002 | Vitenberg |
| 6,479,983 | B1 | 11/2002 | Ebiya |
| 6,691,241 | B1 | 2/2004 | Taylor |
| 6,735,217 | B1 | 5/2004 | Webber, Jr. et al. |
| 6,920,132 | B1 | 7/2005 | Lo |
| 6,973,094 | B1 | 12/2005 | Holloway et al. |
| 7,110,423 | B1 | 9/2006 | Sethuram |
| 7,558,348 | B1 | 7/2009 | Liu et al. |
| 8,243,752 | B2 | 8/2012 | Barkan et al. |
| 8,935,125 | B1 | 1/2015 | Fu et al. |
| 9,454,212 | B1 | 9/2016 | Schulze |
| 9,628,082 | B1 | 4/2017 | Smith et al. |
| 9,696,361 | B1 * | 7/2017 | Sun .................. G01R 27/28 |
| 10,684,977 | B1 | 6/2020 | Seger et al. |
| 2003/0061341 | A1 | 3/2003 | Loh et al. |
| 2003/0200306 | A1 | 10/2003 | Park et al. |
| 2003/0225802 | A1 | 12/2003 | Ruthstein et al. |
| 2004/0145500 | A1 | 7/2004 | Huebl |
| 2004/0240598 | A1 | 12/2004 | Yin |
| 2004/0251912 | A1 | 12/2004 | Pharn et al. |
| 2005/0078683 | A1 | 4/2005 | Page |
| 2005/0128826 | A1 | 6/2005 | Kwack et al. |
| 2006/0109784 | A1 | 5/2006 | Weller et al. |
| 2006/0181283 | A1 * | 8/2006 | Wajcer .................. H04B 3/46 |
| | | | 324/539 |
| 2006/0209710 | A1 | 9/2006 | Watanabe |
| 2007/0008011 | A1 | 1/2007 | Thurston |
| 2007/0121624 | A1 | 5/2007 | Kimbrough et al. |
| 2007/0133586 | A1 | 6/2007 | Ojard et al. |
| 2007/0160087 | A1 | 7/2007 | Findlater et al. |
| 2008/0024178 | A1 | 1/2008 | Kim et al. |
| 2008/0037693 | A1 | 2/2008 | Andrus et al. |
| 2008/0117810 | A1 | 5/2008 | Stott et al. |
| 2008/0159330 | A1 | 7/2008 | Deng et al. |
| 2008/0186996 | A1 | 8/2008 | Powell et al. |
| 2009/0003835 | A1 | 1/2009 | Arahira |
| 2009/0201936 | A1 | 8/2009 | Dumet et al. |
| 2011/0170476 | A1 | 7/2011 | Shapira et al. |
| 2012/0087662 | A1 | 4/2012 | Suzuki et al. |
| 2012/0229214 | A1 | 9/2012 | Kasanyal |
| 2012/0307637 | A1 | 12/2012 | Diab |
| 2013/0021063 | A1 | 1/2013 | Kwon |
| 2013/0101058 | A1 | 4/2013 | Hummel |
| 2013/0229926 | A1 | 9/2013 | Lu et al. |
| 2013/0329773 | A1 | 12/2013 | Cheng et al. |
| 2014/0073352 | A1 | 3/2014 | Aldana et al. |
| 2014/0177653 | A1 | 6/2014 | Tzeng |
| 2014/0268141 | A1 * | 9/2014 | Pariseau ............ G01N 15/1429 |
| | | | 356/336 |
| 2014/0281626 | A1 | 9/2014 | Younger et al. |
| 2015/0063375 | A1 | 3/2015 | Tzeng et al. |
| 2015/0124797 | A1 | 5/2015 | Babitch et al. |
| 2015/0131708 | A1 | 5/2015 | Cornett et al. |
| 2015/0145563 | A1 | 5/2015 | Pardoen |
| 2015/0145581 | A1 | 5/2015 | Palmer et al. |
| 2015/0237178 | A1 | 8/2015 | Zhang |
| 2016/0094362 | A1 | 3/2016 | Brennan |
| 2016/0323287 | A1 | 11/2016 | Kishikawa et al. |
| 2017/0111069 | A1 | 4/2017 | Dafesh et al. |
| 2018/0034658 | A1 | 2/2018 | Kinage et al. |
| 2018/0165056 | A1 | 6/2018 | Lay et al. |
| 2018/0181525 | A1 | 6/2018 | Iyer et al. |
| 2018/0262526 | A1 | 9/2018 | Wang et al. |
| 2018/0314285 | A1 | 11/2018 | Susanto et al. |
| 2019/0179398 | A1 | 6/2019 | Arora et al. |
| 2019/0230705 | A1 | 7/2019 | Beruto et al. |
| 2019/0261420 | A1 | 8/2019 | Axer et al. |
| 2019/0268941 | A1 | 8/2019 | Axer et al. |
| 2019/0313446 | A1 | 10/2019 | Kim et al. |
| 2019/0357146 | A1 | 11/2019 | Kim et al. |
| 2020/0351943 | A1 | 11/2020 | Iyer et al. |
| 2020/0371579 | A1 | 11/2020 | Selvam et al. |

FOREIGN PATENT DOCUMENTS

| | | |
|---|---|---|
| EP | 1388975 A1 | 2/2004 |
| EP | 1940086 A1 | 7/2008 |
| EP | 3094044 A1 | 11/2016 |
| EP | 3573287 A1 | 11/2019 |

OTHER PUBLICATIONS

International Written Opinion from International Application No. PCT/US2020/070347, dated Nov. 16, 2020, 11 pages.

LAN/MAN Standards Committee of the IEEE Computer Society, "Draft Standard for Ethernet Amendment: Physical Layer Specifications and Management Parameters for 10 Mb/s Operation and Associated Power Delivery over a Single Balanced Pair of Conductors," IEEE Draft, P802.3cg/D2.4, Feb. 21, 2019, The Institute of Electrical and Electronics Engineers, Inc., pp. 1-60, New York.

Meier, "Analysis of Worst Case Latencies in an 10 Mbit Ethernet network with PLCA", IEEE Draft, V4, Jan. 17, 2018, pp. 1-11.

Pannell et al., "Quality of Service for PLCA", NXP, May 2018 (May 24, 2018), pp. 1-37, vol. 802.1, No. v02 24, Pittsburg.

U.S. Appl. No. 16/587,505, filed Sep. 30, 2019, titled "Detecting Collisions on a Network", to Zang et al., 34 pages.

U.S. Appl. No. 16/587,583, filed Sep. 30, 2019, titled "Interface for Improved Media Access, and Related Systems, Methods, and Devices", to Chen et al., 51 pages.

U.S. Appl. No. 16/588,562, filed Sep. 30, 2019, titled "Transceiver and Driver Architecture With Low Emission and High Interference Tolerance", to An et al., 36 pages.

U.S. Appl. No. 16/591,294, filed Oct. 2, 2019, titled "Wake Detection At Controller for Physical Layer of Single Pair Ethernet Network, and Related Systems, Methods and Devices", to An et al., 31 pages.

U.S. Appl. No. 16/653,688, filed Oct. 15, 2019, titled "Physical Layer to Link Layer Interface and Related Systems, Methods and Devices", to Iyer et al., 32 pages.

U.S. Appl. No. 16/684,419, filed Nov. 14 2019, titled "Ethernet Interface and Related Systems Methods and Devices", to Iyer et al., 23 pages.

U.S. Appl. No. 16/684,428, filed Nov. 14, 2019, titled "Ethernet Interface and Related Systems Methods and Devices", to Iyer et al., 30 pages.

U.S. Appl. No. 16/843,648, filed Apr. 8, 2020, titled "Emulating Collisions in Wired Local Area Networks and Related Systems, Methods, and Devices", to Iyer et al., 53 pages.

U.S. Appl. No. 62/881,720, filed Aug. 1, 2019, titled "Single Pair Ethernet Physical Layer Architecture and Systems, Devices, and Methods for Implementing the Same", to Iyer et al., 35 pages.

U.S. Appl. No. 62/993,825, filed Mar. 24, 2020, titled "Low Pin Count Handshake Signaling Protocol According to 10BASE-T1X Local and Remote Wake Detect and Related Systems, Methods, and Devices", to Iyer et al., 13 pages.

Fitzgerald: "10BASE-T1L Low Power Idle (802.3cg D2.0)", IEEE—SA, Acuitas Silicon, (Aug. 15, 2018) 9 pages.

* cited by examiner

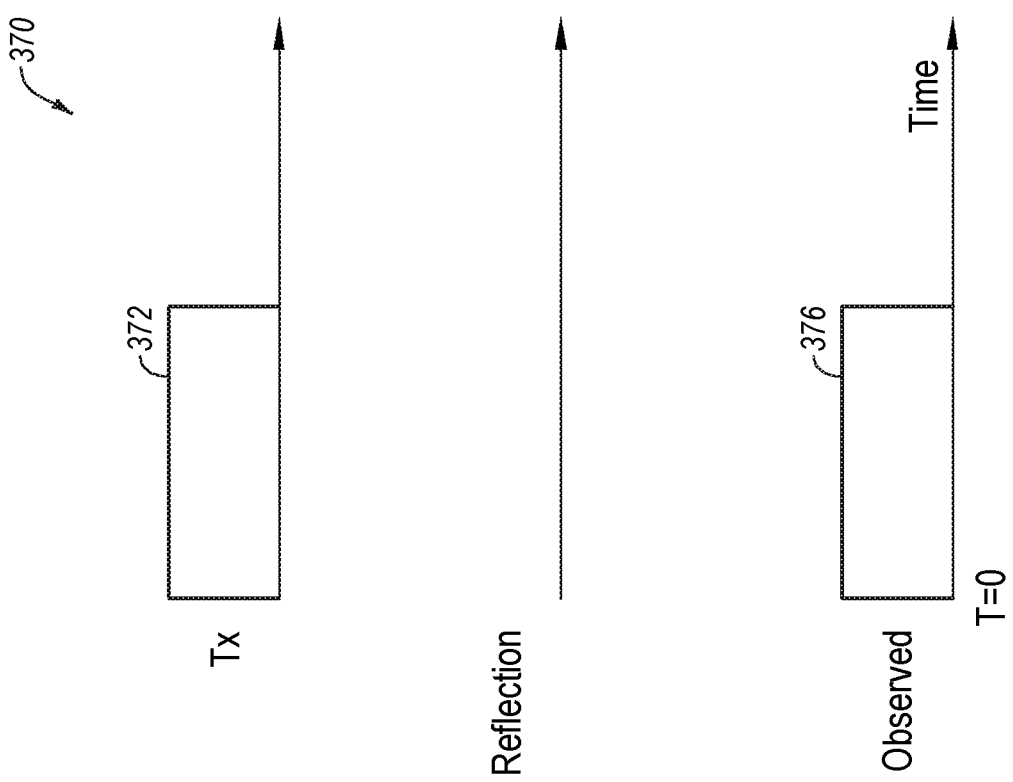

DIAGNOSING CABLE FAULTS WITHIN A NETWORK

PRIORITY CLAIM

This application claims the benefit of the filing date of Chinese Provisional Patent Application Serial No. 201910784058.2, filed Aug. 23, 2019, for "DIAGNOSING CABLE FAULTS WITHIN A NETWORK."

TECHNICAL FIELD

The present disclosure relates generally to data communication networks, and more specifically, to diagnosing cable faults within a local area network. Yet more specifically, various embodiments of the disclosure relate to diagnosing cable faults within a single pair Ethernet network via time-domain reflectometry.

BACKGROUND

Various interface standards for connecting computers and external peripherals may be used to provide connectivity at high speeds. A widely used, flexible networking standard for connecting computers (e.g., in Local Area Networks (LANs) and Wide Area Networks (WANs)) is the Ethernet protocol. Ethernet communication generally refers to point-to-point communication within a network of multiple end points. Ethernet generally makes efficient use of shared resources, is easy to maintain and reconfigure, and is compatible across many systems.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 3C shows another timing diagram depicting a transmit pulse signal and an observed signal;

DETAILED DESCRIPTION

Figure 1:
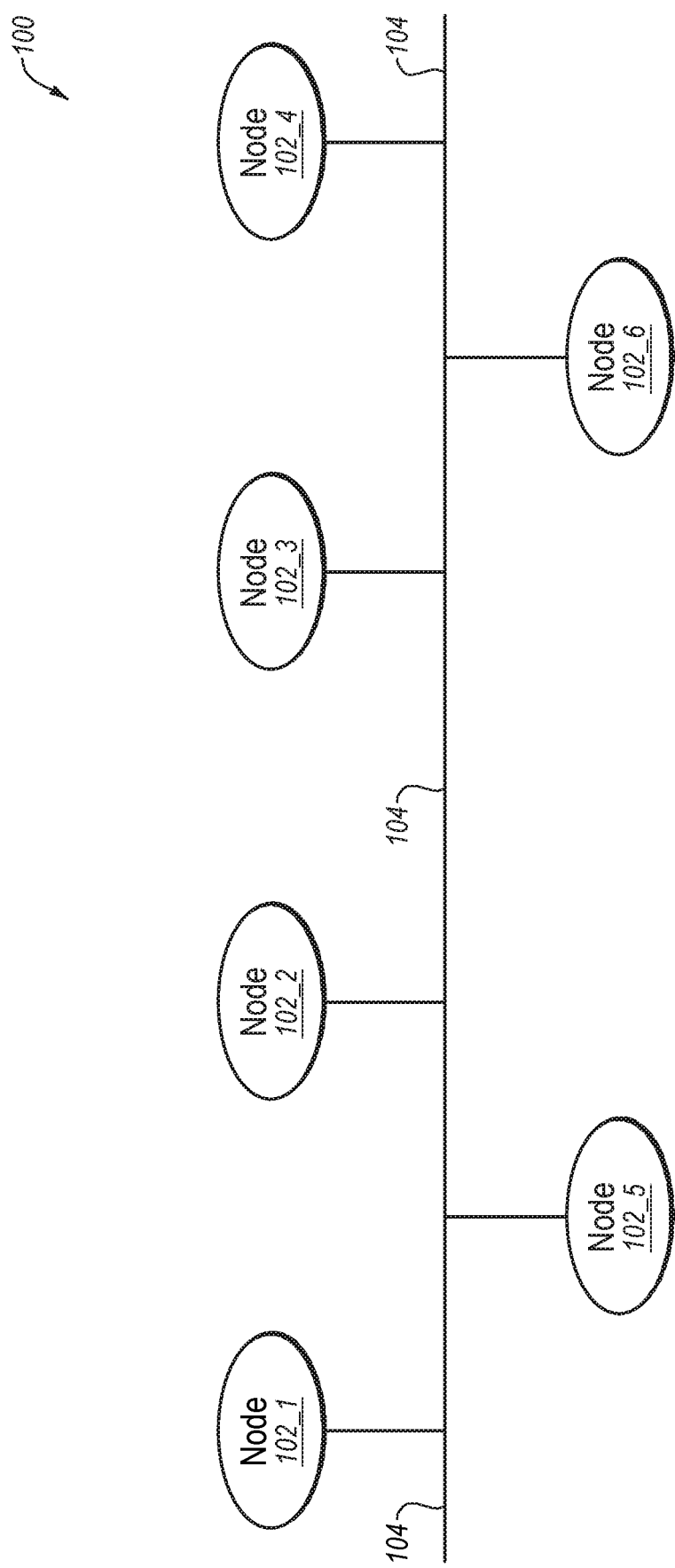
FIG. 1 depicts a network including a number of nodes, in accordance with various embodiments of the disclosure.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

A vehicle, such as an automobile, a truck, a bus, a ship, and/or an aircraft, may include a vehicle communication network. The complexity of a vehicle communication network may vary depending on a number of electronic devices within the network. For example, an advanced vehicle communication network may include various control modules for, for example, engine control, transmission control, safety control (e.g., antilock braking), and emissions control. To support these modules, the automotive industry relies on various communication protocols.

10SPE (i.e., 10 Mbps Single Pair Ethernet) is network technology specification currently under development by the Institute of Electrical and Electronics Engineers as specification IEEE 802.3cg™. A 10SPE physical layer (PHY) may operate in a half-duplex mode and may support carrier-sense multiple access with collision detection (CSMA/CD), which is a media access control method used most notably in early Ethernet technology for local area networking.

Cable fault diagnosis is necessary for various applications, such as in vehicle communication networks utilizing 10SPE. However, 10SPE does not define cable fault diagnosis.

Various embodiments relate to detecting cable fault types, including cable "open" and cable "short" faults, based on time domain reflection. More specifically, various embodiments relate to detecting, and possibly diagnosing, cable faults in a 10SPE network. Yet more specifically, various embodiments relate to a 10SPE physical layer (PHY) configured to detect cable fault types (e.g., cable open, cable short, normal, mismatch) of an associated 10SPE network based on time domain reflection (TDR).

In some embodiments, a 10SPE PHY may include detection circuitry (e.g., including a signal detector with a programmable threshold value) configured for detecting, and possibly diagnosing, cable faults in a 10SPE network. According to some embodiments, as described more fully below, during a contemplated operation, a pulse may be transmitted from a PHY, and if a reflection is not detected at the PHY, it may be determined that no cable fault exists (e.g., a cable diagnosis of "normal"). However, if a reflection is detected at the PHY, it may be determined that a cable fault exists. Further, based on the detected reflection (e.g., a phase and/or an orientation (positive or negative)), a type of cable fault may be determined. More specifically, if the detected reflection includes a shape that is similar to a shape of the transmitted pulse, it may be determined that an "open" fault exists. If the detected reflection includes a shape that is similar to, but opposite of, the transmitted pulse, it may be determined that a "short" fault exits. Further, if the detected reflection includes an amplitude that is different than an amplitude of the transmitted pulse, it may be determined that a "mismatch" fault exists. More specifically, if the detected reflection includes a shape that is similar to a shape of the transmitted pulse, and the reflection and the transmitted pulse have different amplitudes, it may be determined that an "open mismatch" fault exists. Further, if the detected reflection includes a shape that is similar to, but opposite of, the transmitted pulse, and the reflection and the transmitted pulse have different amplitudes, it may be determined that a "short mismatch" fault exits.

According to a more specific example described more fully below, a signal detector of a PHY may be configured with a first threshold value (e.g., a high threshold value), and the PHY may transmit a first pulse via a cable that is coupled to a network (e.g., 10 SPE network). For example, the first pulse may be a positive pulse, a negative pulse, or a differential pulse. For example, the first threshold value may be between 1× and 2×, wherein X is an amplitude of the first pulse. Further, a first signal, received in response to the first pulse, may be observed at the PHY. Furthermore, a state (also referred to herein as a "value") of the first signal at each sampling time of a number of sampling times of the first signal may be determined (i.e., based on a comparison to the first threshold value), and possibly recorded.

Continuing with this specific example, the signal detector may be configured with at least one other threshold value (e.g., a medium threshold value and/or a negative threshold value), and at least other pulse may be transmitted via the cable. Further, at least one other signal, received in response to the second pulse, may be observed at the PHY. Furthermore, a state of the at least one other signal at each sampling time of a number of sampling times of the at least one other signal may be determined (i.e., based on a comparison to the at least one other threshold value).

More specifically, the signal detector may be configured with a second threshold value (e.g., a medium threshold value), and a second pulse may be transmitted via the cable. For example, the second pulse be substantially similar to the first pulse (e.g., same shape, amplitude, and duration). Further, for example, the second threshold value may be between 0 and X, wherein X is an amplitude of the second pulse. Further, a second signal, received in response to the second pulse, may be observed at the PHY. Furthermore, a state of the second signal at each sampling time of a number of sampling times of the second signal may be determined (i.e., based on a comparison to the second threshold value), and possibly recorded.

Continuing with this specific example, the signal detector may be configured with a third threshold value (e.g., a negative threshold value), and a third pulse may be transmitted via the cable. For example, the third pulse be substantially similar to the first pulse and the second pules (e.g., same shape, amplitude, and duration). Further, for example, the third threshold value may be between 0 and −X, wherein X is an amplitude of the third pulse. Further, a third signal, received in response to the second pulse, may be observed at the PHY. Furthermore, a state of the third signal at each sampling time of a number of sampling times of the third signal may be determined (i.e., based on a comparison to the third threshold value), and possibly recorded.

Continuing with this specific example, as described more fully below, a reflection signal may be determined based on a transmitted pulse (e.g., the first pulse, the second pulse, or the third pulse) and a state of each observed signal (e.g., the first, second, and third observed signals) at each sampling time of a number of sampling times of observed signals. Further, as described more fully below, the reflection signal may be used to determine a fault type and/or a location of a fault.

In some embodiments, an output of a signal detector of a PHY may be oversampled (e.g., to increase resolution in the time domain). More specifically, for example, for a 40 nanosecond transmit pulse, an output of a signal detector may be sampled every 10 nanoseconds.

Various embodiments of the present disclosure are now explained with reference to the accompanying drawings.

FIG. 1 is a block diagram of at least a portion of a network (e.g., a wired local area network) 100, according to some embodiments. More specifically, network 100 may include a 10SPE network. Network 100 includes a number of nodes (also referred to as "endpoints") operably coupled to a communication bus 104 (e.g., including one or more cables). More specifically, network 100 includes nodes 102_1, 102_2, 102_3, 102_4, 102_5, and 102_6, generally nodes 102. Although network 100 is depicted as having six nodes, the disclosure is not so limited, and a network may include more than six nodes (e.g., eight nodes, ten nodes, twelve nodes, or more) or less than six nodes (e.g., five nodes, three nodes, or two nodes).

Each node 102_1, 102_2, 102_3, 102_4, 102_5, and 102_6 is configured to communicate via communication bus 104, which may include, or be, a shared bus (e.g., a single twisted pair). As used herein, the term "shared bus" refers to a wired transmission medium, such as a single twisted pair, that conducts both transmit signals and receive signals over the same conductive structure (e.g., one or more cables).

In at least some embodiments, network 100 may be used in an automotive environment. More specifically, by way of non-limiting example, network 100 may be configured to connect one or more of nodes 102 to other nodes, a computer, and/or controller (e.g., within a vehicle). In this example, each node 102 of network 100 may include, for example, an amplifier, a microphone, an antenna, a speaker, and/or a sensor, without limitation.

Figure 2:
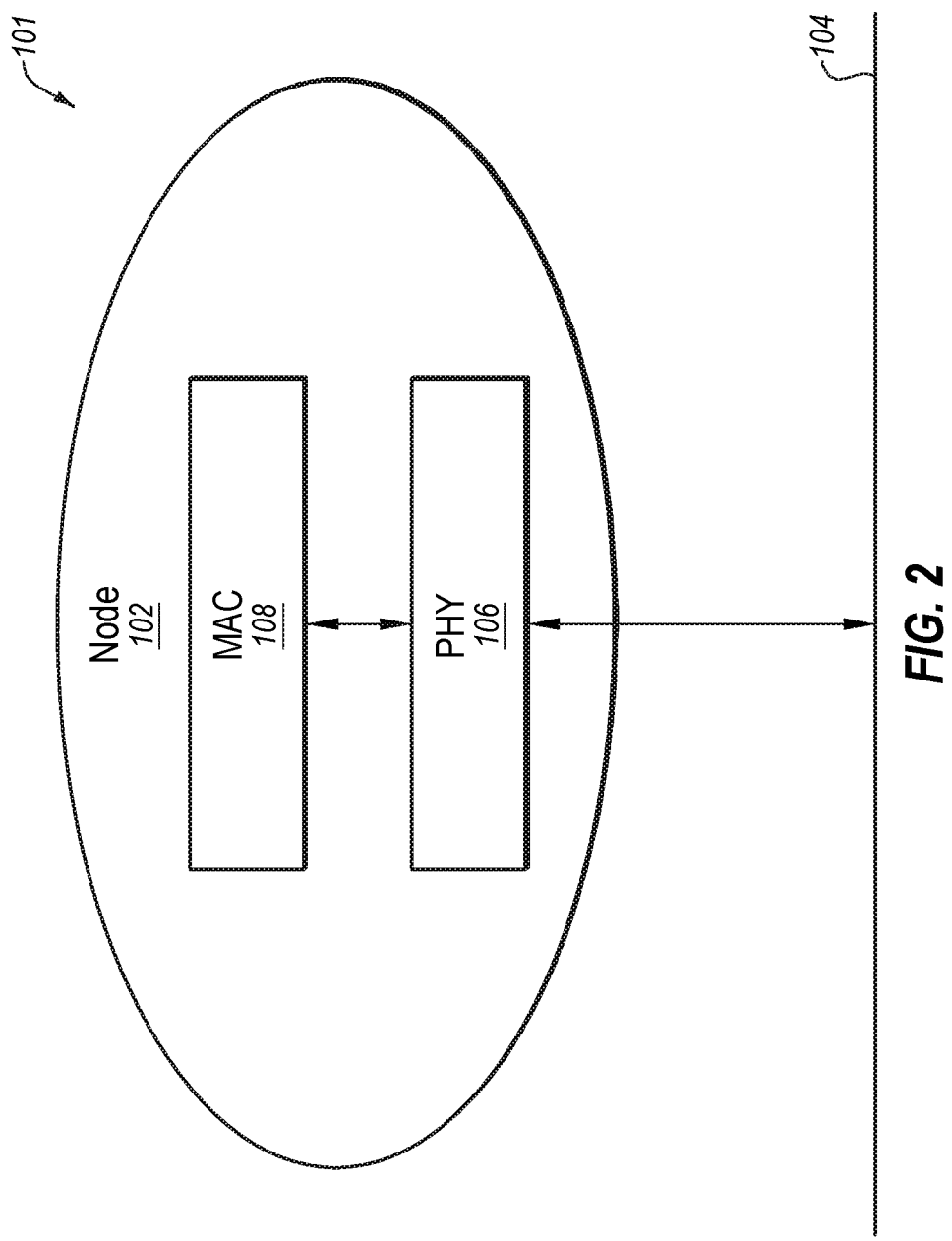
FIG. 2 illustrates a node, including a media access layer and a physical layer, coupled to a network, according to various embodiments of the disclosure.

FIG. 2 depicts an example network segment 101 including anode 102 (e.g., node 102_1, node 102_2, node 102_3, node 102_4, node 102_5, or node 102_6) coupled to communication bus 104. As shown in FIG. 2, node 102 includes a physical layer (PHY) 106 operably coupled to a media access control (MAC) layer 108. PHY 106 may be configured to serve as an interface for a physical connection between MAC 108 and a network or device via communication bus 104. In some embodiments, PHY 106 includes at least a portion of Ethernet physical layer circuitry. As described more fully below, a PHY (e.g., PHY 106) may include a transceiver having transmit circuitry and receive circuitry, and detection circuitry including at least one signal detector.

Figure 3B:
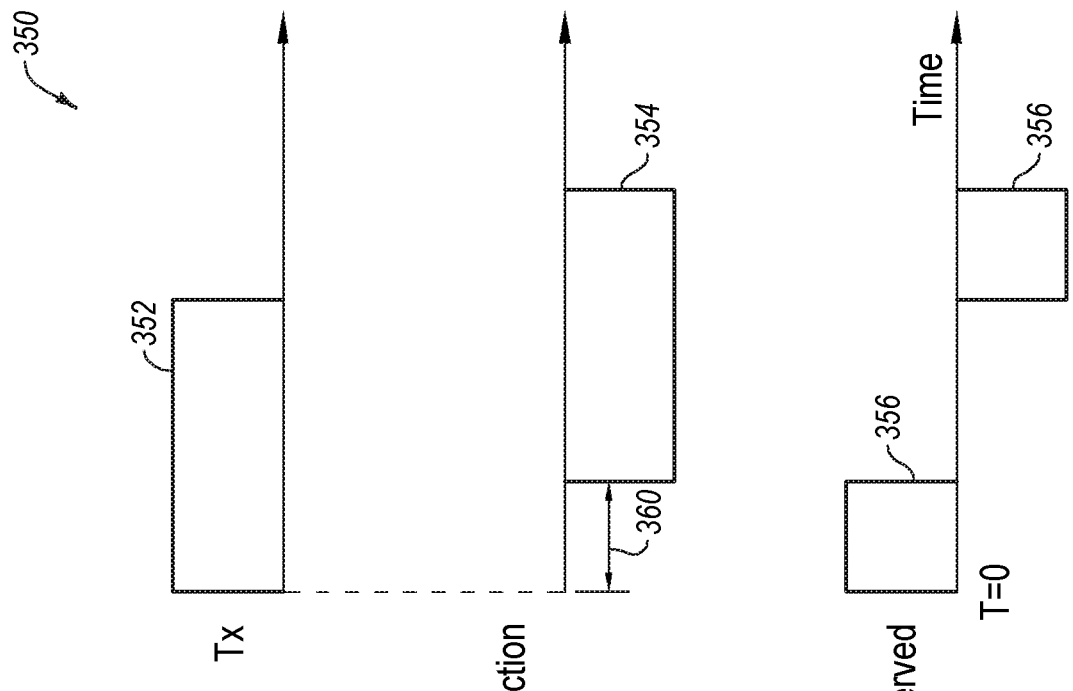
FIG. 3B shows another timing diagram depicting a transmit pulse signal, a reflection signal, and an observed signal.
Figure 3A:
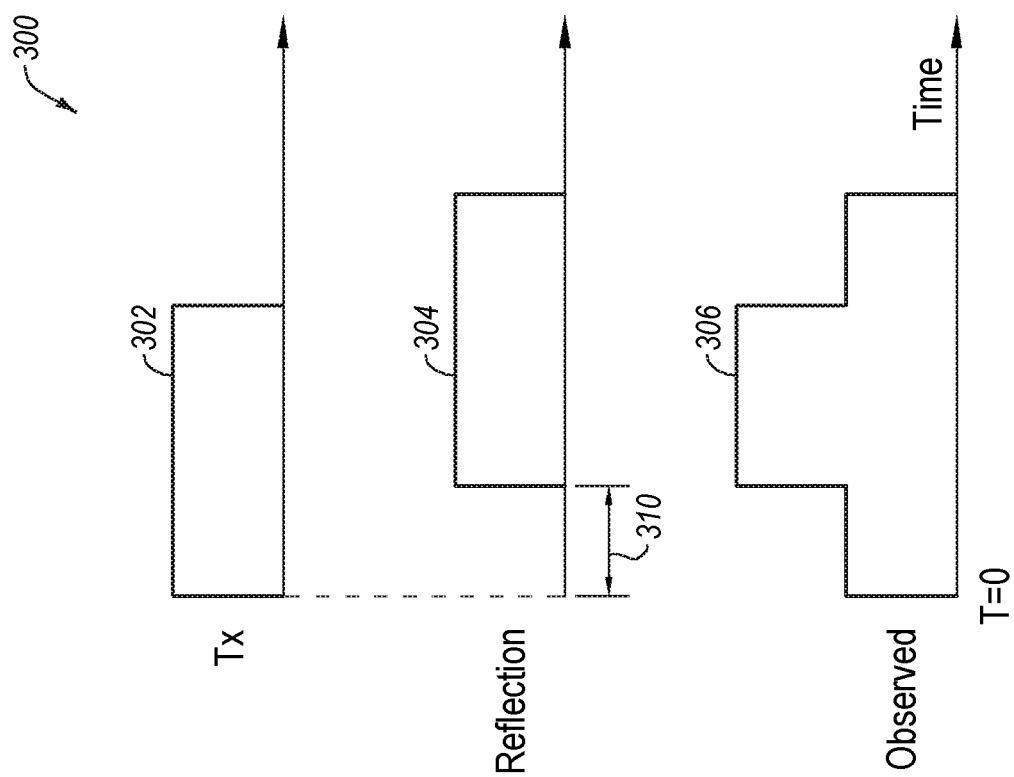
FIG. 3A shows a timing diagram depicting a transmit pulse signal, a reflection signal, and an observed signal.

FIG. 3A includes a timing diagram 300 depicting a transmit pulse signal 302, a reflection signal 304, and an observed signal 306. For example, transmit pulse signal 302 represents a signal transmitted from a PHY (e.g., of node 102_1 of FIG. 1), reflection signal 304 represents a reflection of transmit pulse signal 302, and observed signal 306 represents a signal observed at the transmitting PHY (e.g., of node 102_1 of FIG. 1), i.e., in response to transmit pulse signal 302.

As will be appreciated, observed signal 306 includes both transmit pulse signal 302 and reflection signal 304. According to various embodiments, as described more fully below, information about a reflection signal (e.g., reflection signal 304) may be derived from an observed signal (e.g., observed signal 306). In other words, it may be possible to determine information about reflection signal 304 (e.g., a shape, a phase, and/or an orientation (i.e., either positive or negative)) based on information about transmit pulse signal 302 and observed signal 306. Further, based on information about reflection signal 304 (e.g., phase and/or orientation), a type of a cable fault (i.e., a fault with one or more cables of communication bus 104 of FIGS. 1 and 2) may be determined. In the example shown in FIG. 3A, transmit pulse signal 302 and reflection signal 304 are both positive and include similar pulse shapes, which is indicative of an "open" fault.

With continued reference to timing diagram 300, a location of a cable fault may be determined based on a time duration 310 between a rising edge of transmit pulse signal 302 and a rising edge of reflection signal 304. More specifically, for example, it may be determined that time duration 310 is equal to 20 nanoseconds, and assuming 5 nanoseconds/meter, it may be determined that the cable fault is about 2 meters away from the associated node, e.g., node 102_1. An example method of determining a location of a cable fault will be described below with reference to FIGS. 4A and 4B.

In some embodiments, determining a location of a cable fault may require information from more than one node of a network. More specifically, each node of a number of nodes of a network may transmit a signal, and each node may determine a reflection signal (i.e., based on a transmitted pulse and an observed signal). Further, using timing information from each node (i.e., a time duration between a transmitted signal and a reflection signal), a location of a cable fault (i.e., on communication bus 104; see FIG. 1 or FIG. 2) may be determined.

FIG. 3B depicts another timing diagram 350 including a transmit pulse signal 352, a reflection signal 354, and an observed signal 356. For example, transmit pulse signal 352 represents a signal transmitted from a PHY (e.g., of node 102_1 of FIG. 1), reflection signal 354 represents a reflection of transmit pulse signal 352, and observed signal 356 represents a signal observed at the transmitting PHY (e.g., of node 102_1 of FIG. 1), i.e., in response to transmit pulse signal 352.

As will be appreciated, observed signal 356 includes both transmit pulse signal 352 and reflection signal 354. According to various embodiments, as described more fully below, information about reflection signal 354 may be derived from observed signal 356. In other words, it may be possible to determine e.g., a shape, a phase, and/or an orientation (i.e., either positive or negative) of reflection signal 354 based on information about transmit pulse signal 352 and observed signal 356. Further, based on reflection signal 354 (e.g., phase and/or orientation) relative to transmit pulse signal 352, a type of a cable fault may be determined. In the example shown in FIG. 3B, which is indicative of a "short" fault, transmit pulse signal 352 and reflection signal 354 include similar shapes, but one is positive and one is negative. Further, a location of the fault may be determined based on time duration 360 between a rising edge of transmit pulse signal 352 and a falling edge of reflection signal 354.

With reference to a timing diagram 370 shown in FIG. 3C, it is noted that if an observed signal 376 includes the same shape, amplitude, and orientation of a transmit pulse signal 372 (i.e., at each sampling time), a reflection signal may not exist, and thus it may be determined that a network (e.g., network 100 of FIG. 1) does not include a cable fault (e.g., a properly terminated or normal condition).

Figure 4A:
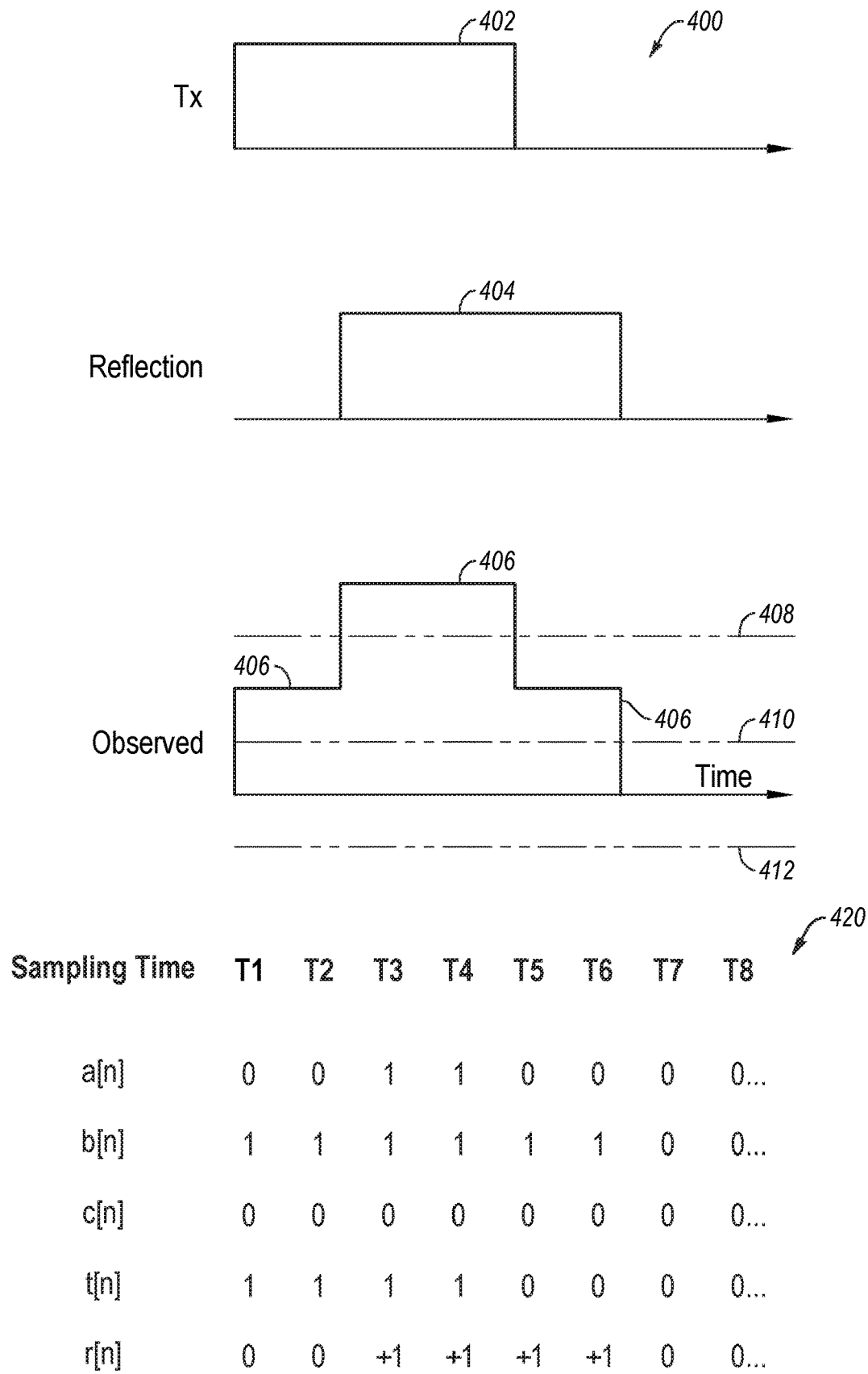
FIG. 4A shows a timing diagram depicting a transmit pulse signal, a reflection signal, an observed signal, and a signal states for a number of sampling times.

FIG. 4A depicts a timing diagram 400 including a transmit pulse signal 402, a reflection signal 404, and an observed signal 406, observed at the node with transmitted transmit pulse signal 402. For example, transmit pulse signal 402 represents a signal transmitted from a PHY (e.g., of node 102 of FIG. 2), reflection signal 404 represents a reflection of transmit pulse signal 402, and observed signal 406 represents a signal observed at the transmitting PHY (e.g., of node 102 of FIG. 2). FIG. 4A further depicts a first (e.g., high) threshold value 408, a second (e.g., normal) threshold value 410, and a third (e.g., low) threshold value 412.

FIG. 4A further depicts a matrix 420 including a number of vectors including a vector a[n], a vector b[n], a vector c[n], a vector t[n], and a vector r[n]. Each column of matrix 420 is associated with a sampling time T1-T8, and each vector (i.e., a[n], b[n], c[n], t[n], and r[n]) includes an element n for each sampling time. As shown in FIG. 4A, a width of transmit pulse signal 402 is such that it is sampled four times at the sampling rate. In other words, transmit pulse signal 402 includes four sampling times (i.e., T1-T4). More specifically, for example, transmit pulse signal 402 may include a pulse width of 40 nanoseconds, and may be sampled at 10 nanosecond intervals.

In this example, vector a[n] is associated with observed signal 406 relative to first threshold value 408, vector b[n] is associated with observed signal 406 relative to second threshold value 410, and vector c[n] is associated with observed signal 406 relative to third threshold value 412. Further, vector t[n] is associated with transmit pulse signal 402, and vector r[n] is associated with reflection signal 404. As described more fully below, each element n of each vector may be set to a logic value (e.g., either a 0 or a 1 or a 0 and a 2) depending on a comparison of an associated sample of observed signal 406 to the respective threshold value. The values of t[n] are determined based on the status of the transmitted signal (e.g., "1" for high, and "0" for low). More specifically, if transmit pulse signal 402 is a positive pulse, each element of vector t[n] will be a "1" for each sampling time of transmit pulse signal 402. Further, if transmit pulse signal 402 is a negative pulse, each element of vector t[n] will be a "1" for each sampling time of transmit pulse signal 402. The values of r[n], which will either be 0, 1, or −1, are determined responsive to equation (1) detailed below.

According to various embodiments, an example operation will now be described with reference to FIG. 4A. In this example, first threshold value 408 may be set, transmit pulse signal 402 may be transmitted and, for each sampling time of a number of sample times (e.g., T1-T8), observed signal 406 may be sampled and compared to first threshold value 408 to generate an vector of elements a[n] for the observed signal 406. More specifically, a signal detector (e.g., a signal detector 600 of FIG. 6) may be programmed with first threshold value 408 (e.g., between 1× and 2×, wherein X is an amplitude of transmit pulse signal 402), the transmit pulse signal 402 may be transmitted, and an output of the signal detector 600 may be sampled (i.e., at each sampling time), and possibly recorded.

More specifically, for vector a[n], at the first two sampling times T1 and T2, the samples of observed signal 406 are not greater than first threshold value 408, and thus the values of a[1] and a[2] are each 0. Further, for the next two sampling times (i.e., T3 and T4), the samples of observed signal 406 are greater than first threshold value 408, and thus, the values of a[3] and a[4] are each 1. For the remaining sampling times (i.e., T5-T8), the samples of observed signal 406 are not greater than first threshold value 408, and thus the values of a[5], a[6], a[7], and a[8] are each 0.

Continuing with this example, second threshold value 410 may be set, transmit pulse signal 402 may be transmitted again, and, for each sampling time of a number of sample times (e.g., T1-T8), observed signal 406 may be sampled and compared to second threshold value 410 to generate a vector of elements b[n] for the observed signal. More specifically, signal detector 600 of FIG. 6 may be programmed with the second threshold value (e.g., between 0 and X, wherein X is an amplitude of transmit pulse signal 402, transmit pulse signal 402 may be transmitted, and an output of signal detector 600 may be sampled (i.e., at each sampling time), and possibly recorded.

For b[n], at the first six sampling times T1-T6, the samples of observed signal 406 are greater than second threshold value 410, and thus, the values of b[1]-b[6] are each 1. Further, for the next two sampling times (i.e., T7 and T8), the samples of observed signal 406 are not greater than second threshold value 410, and thus the values of b[7] and b[8] are each 0.

Continuing with this example, third threshold value 412 may be set, transmit pulse signal 402 may be transmitted again, and, for each sampling time of a number of sample times (e.g., T1-T8), observed signal 406 may be sampled and compared to third threshold value 412 to generate an array of elements c[n] for observed signal 406. More specifically, signal detector 600 may be programmed with third threshold value 412 (e.g., between 0 and −X, wherein X is an amplitude of the pulse), transmit pulse signal 402 may be transmitted, and an output of signal detector 600 may be sampled (i.e., at each sampling time), and possibly recorded.

For c[n], at each sampling time T1-T8, the samples of observed signal 406 are not less than third threshold value 412, and thus, the values of c[1]-b[7] are each 0.

Further, in this example, the values of transmit pulse signal 402 (i.e., for each threshold value setting) at sampling times T1-T8 is 1, 1, 1, 1, 0, 0, 0, 0 (i.e., t[n]=(1, 1, 1, 1, 0, 0, 0, 0), based on the setting of the transmitter, i.e., "1" when the transmitter is transmitting a high signal, and "0" otherwise. Further, a value of a reflection array r[n] at each sampling time (e.g., along columns of matrix 420) may be determined via the following equation:

$$r[n]=a[n]+b[n]-c[n]-t[n]. \quad (1)$$

As will be appreciated, based on equation (1), at each sampling time, r[n] is equal to the element of vector a[n] plus the element of vector b[n] minus the element of vector c[n] minus the element of vector t[n]. Based on equation (1) above, array r[n]=(0 0, +1, +1, +1, +1, 0, 0). According to various embodiments, because array r[n] includes a positive value, an "open" fault exists.

Figure 4B:
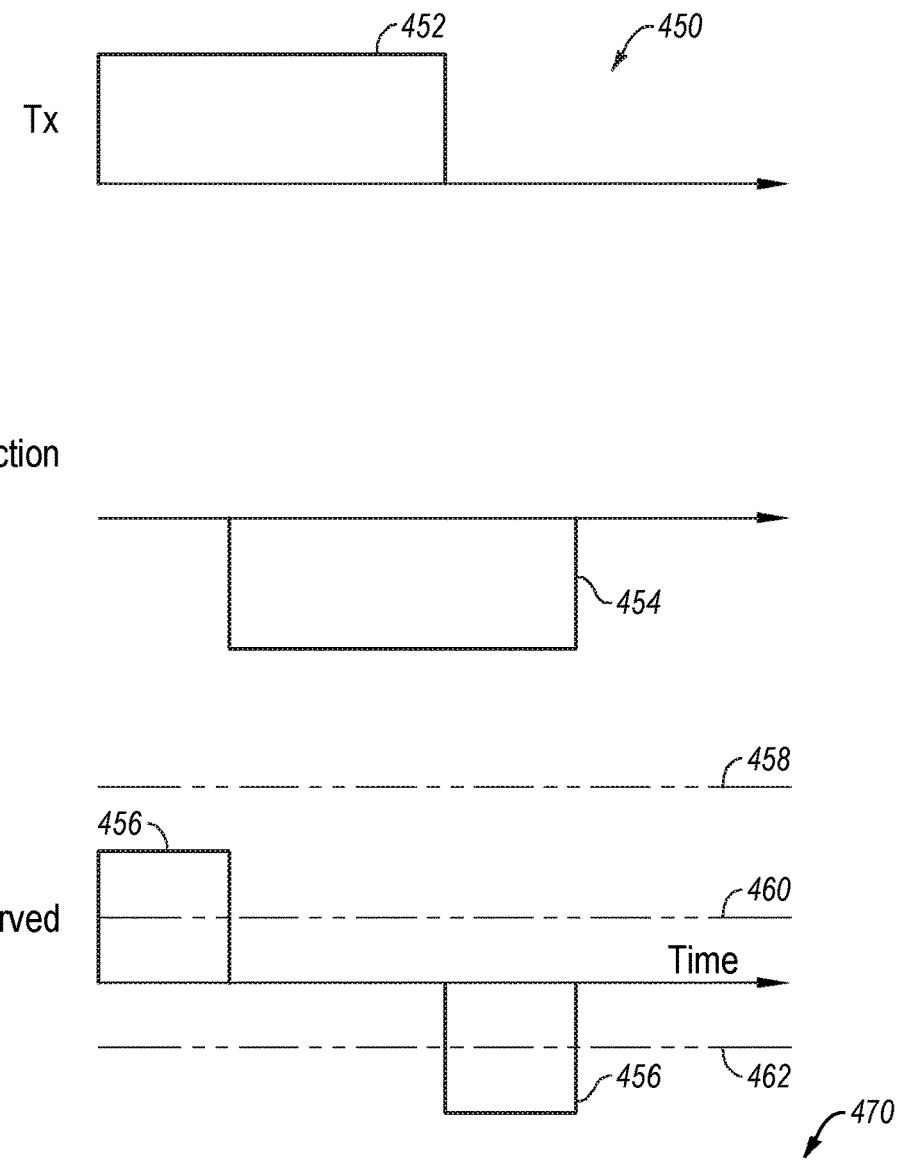
FIG. 4B shows another timing diagram depicting a transmit pulse signal, a reflection signal, an observed signal, and signal states for a number of sampling times.

Another example operation will now be described with reference to FIG. 4B. FIG. 4B is a timing diagram 450 depicting a transmit pulse signal 452, a reflection signal 454, and an observed signal 456, observed at the node with transmitted transmit pulse signal 452. For example, transmit pulse signal 452 represents a signal transmitted from a PHY (e.g., of node 102 of FIG. 2), reflection signal 454 represents a reflection of transmit pulse signal 452, and observed signal 456 represents a signal observed at the PHY (e.g., of node 102 of FIG. 2). FIG. 4B further depicts a first (e.g., high) threshold value 458, a second (e.g., normal) threshold value 460, and a third (e.g., low) threshold value 462.

FIG. 4B further depicts a matrix 470 including a number arrays including an array a[n], an array b[n], an array c[n], an array t[n], and an array r[n]. Each column of matrix 470 is associated with a sampling time T1-T8, and each array (i.e., a[n], b[n], c[n], t[n], and r[n]) includes an element n for each sampling time. Similar to transmit pulse signal 402 of FIG. 4A, transmit pulse signal 452 is 4× a sampling rate. In other words, transmit pulse signal 452 is sampled 4 times over the length of transmit pulse signal 452 (i.e., T1-T4).

In this example, array a[n] is associated with observed signal 456 relative to first threshold value 458, array b[n] is associated with observed signal 456 relative to second threshold value 460, and array c[n] is associated with observed signal 456 relative to third threshold value 462. Further, array t[n] is associated with transmit pulse signal 452, and array r[n] is associated with reflection signal 454. As described more fully below, each element n of each array may be set to either a 0 or a 1 depending on a comparison of an associated sample of observed signal 456 to a respective threshold value. The values of t[n] are determined based on the status of the transmitted signal, i.e., "1" for high, and "0" for low. The values of r[n] are determined responsive to equation (1) above.

Similar to as described above with reference to FIG. 4A, respective threshold values may be set, transmit pulse signal 452 may be transmitted and, for each sampling time of a number of sample times, an observed signal may be compared to the threshold value to generate an array of elements n for the observed signal relative to the threshold value. This may be repeated for one or more additional threshold values.

For the example shown in FIG. 4B, for array a[n], at each sampling time T1-T8, the samples of observed signal 456 are not greater than first threshold value 458, and thus the values of a[1]-a[8] are each 0. For b[n], at the first two sampling times T1 and T2, the samples of observed signal 456 are greater than second threshold value 460, and thus, the values of b[1] and b[2] are each 1. Further, for the next six sampling times T3-T8, the samples of observed signal 456 are not greater than second threshold value 460, and thus the values of b[3]-b[8] are each 0.

For c[n], for the first four sampling times T1-T4, the samples of observed signal 456 are not less than third threshold value 462, and thus, the values of c[1]-c[4] are each 0. For the next two sampling times T5 and T6, the samples of observed signal 456 are less than third threshold value 462, and thus, the values of c[5] and c[6] are each 1. For the next two sampling times T7 and T8, the samples of observed signal 456 are not less than third threshold value 462, and thus, the values of c[7] and c[8] are each 0.

Further, in this example, the values of transmit pulse signal 452 transmitted at sampling times T1-T8 may be 1, 1, 1, 1, 0, 0, 0, 0 (i.e., t[n]=(1, 1, 1, 1, 0, 0, 0, 0). Based on equation (1) above, array r[n]=(0, 0, −1, −1, −1, −1, 0, 0). According to various embodiments, because array r[n] includes a negative value, a "short" fault exists. It is noted that if array r[n] included all zeros, a reflection was not received, and thus it may be determined that a cable fault does not exist.

Further, a fault position may be determined based on the first non-zero element in array r[n]. More specifically, in the example in which array r[n]=(0, 0, −1, −1, −1, −1, 0, 0), the first non-zero of array r[n] is at the third sampling time. Further, assuming each sampling time is 10 nanoseconds, and further assuming 5 nanoseconds/meter, it may be determined that the cable fault is about 3 meters away from the associated node.

Figure 5:
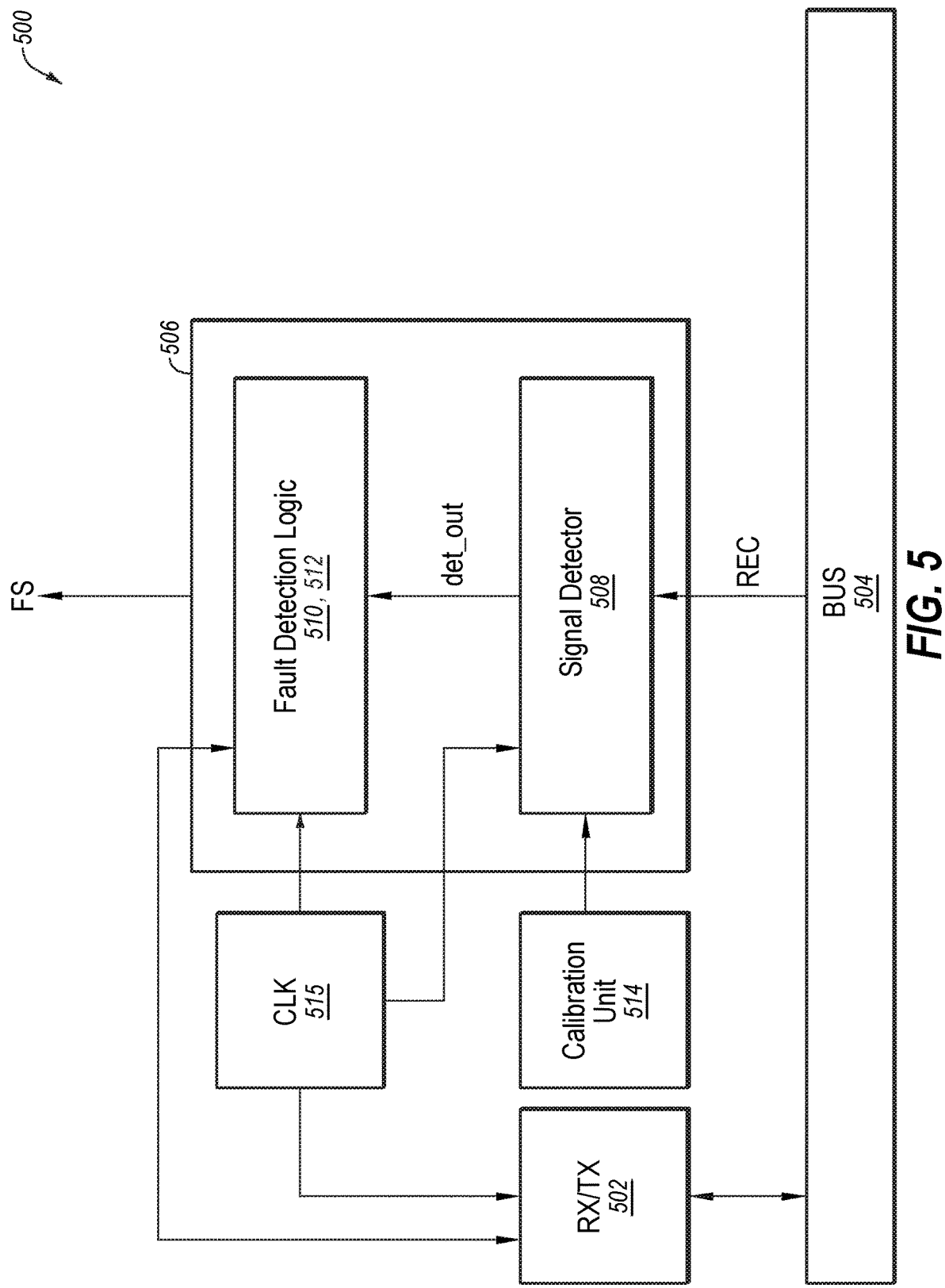
FIG. 5 illustrates an example physical layer of a node of a network, according to various embodiments of the disclosure.

FIG. 5 illustrates an example PHY 500, in accordance to various embodiments of the disclosure. PHY 500 is provided as an example PHY configuration that may be used for carrying out various embodiments disclosed herein; however, the disclosure is not limited to any specific PHY configuration, and other configurations may be within the scope of the disclosure.

For example, PHY 106 of FIG. 2 may include PHY 500. PHY 500 includes receive and transmit circuitry 502, which may be coupled to a communication bus 504 and a MAC (not shown in FIG. 5, e.g., MAC 108 of FIG. 2). For example, communication bus 504 may include communication bus 104 of FIG. 1 and FIG. 2. Communication bus 504, which may be used for both transmitting and receiving data, may include a single twisted pair (e.g., an Unshielded Twisted Pair, or UTP).

PHY 500 further includes a controller 506, which may include a signal detector 508 and fault detection logic 510. As described more fully herein, in response to a transmitted signal (i.e., a signal transmitted via PHY 500, such as transmit pulse signal 302 of FIG. 3A or transmit pulse signal 352 of FIG. 3B), controller 506 may be configured to detect an amplitude of an observed signal at a number of samplings times. More specifically, as described above with reference to FIGS. 4A and 4B, the amplitude of the observed signal (e.g., observed signal 406 or observed signal 456) at each sampling time may be used, along with the amplitude of the transmit pulse signal at each sampling time, to determine if the observed signal includes a reflection of the transmit pulse signal. PHY 500 may further include a calibration unit 514 for programming signal detector 508 with one or more threshold values.

Signal detector 508 may be configured to detect signals observed via communication bus 504. More specifically, a signal REC, which may include a differential signal (e.g., signal RXP, RXN shown in FIG. 6) may be observed at signal detector 508 via communication bus 504. For each sampling time of a number of sampling times (e.g., T1-T8; see FIGS. 4A and 4B), signal detector 508 may detect an amplitude of signal REC, compare the amplitude to a threshold value, and convey a signal det_out, which may be a logic value (e.g., 0 or 1) that is indicative of the amplitude of signal REC at a sampling time compared to the threshold value. If, for a sampling time, the absolute value of the amplitude of signal REC is equal to or greater than the threshold value, signal det_out may include a first logic value (e.g., a logic 1). If, for a sampling time, the absolute value of the amplitude of signal REC is less than the threshold value, signal det_out may be a second, different logic value (e.g., a logic 0).

For example, for each sampling time of a number of sampling time, signal det_out may be supplied to fault detection logic 510, which may store the values of signal det_out. This may be repeated for each sampling time to generate a vector of logic values (e.g., array a[n] of FIG. 4A or FIG. 4B) for signal REC compared to the threshold value. The vector may be stored in fault detection logic 510. This may be repeated for each threshold value to generate additional vectors of logic values (e.g., array b[n] and c[n] of FIG. 4A or FIG. 4B), which may also be stored in fault detection logic 510. Moreover, according to some embodiment, vector t[n] may be determined based on information (e.g., pulse width and/or amplitude) about a transmitted pulse signal, wherein the information may be transmitted from receive and transmit circuitry 502 to fault detection logic 510. Further, after generating arrays for each threshold value, fault detection logic 510 may compute reflection array r[n] according to equation (1) provided above. Further, based on array r[n], fault detection logic 510 may be configured to determine a fault type (e.g., via a lookup table) and possibly a location of the fault (e.g., based on a first non-zero value of array r[n]). Also, fault detection logic 510 may be configured to generate a signal FS indicative of a fault, or lack thereof. For example, signal FS may be conveyed to a MAC (e.g., MAC 108 of FIG. 2) and/or one or more other nodes of a network.

In some embodiments, PHY 500 may also include a clock 515 (e.g., a 100 MHz clock) for generating a clock signal, which may be conveyed to fault detection logic 510, transmit and receive circuitry 502, and signal detector 508. For example only, the clock signal may be used to trigger sampling, clock sampling logic, and/or determine a time duration between signal transmission (e.g., a rising edge of a transmit pulse) and reception of a pulse (e.g., a rising edge of reflection signal).

It is noted that in some embodiments, at least some portions of transmitter (e.g., a pulse shaper and/or a driver) and/or at least some portions of a receiver (e.g., a signal detector) may be in a chip separate from a chip including signal detector 508 and fault detection logic 512.

Figure 6:
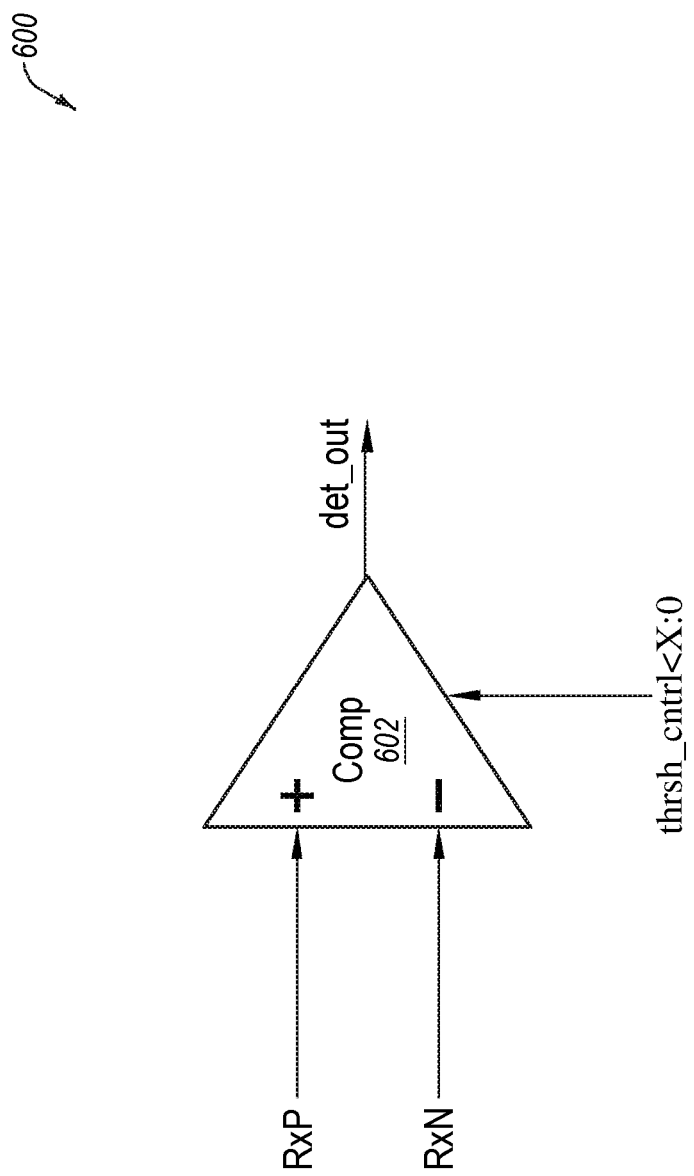
FIG. 6 illustrates a signal detector, according to various embodiments of the disclosure.

FIG. 6 illustrates an example signal detector 600, according to various embodiments of the disclosure. As illustrated, signal detector 600 includes a comparator 602 configured, generally, to compare a differential signal (i.e., a measured difference between the + and − inputs of comparator 602 shown in FIG. 2) to a threshold and convey an output signal, det_out in response to the comparison. During a contemplated operation of signal detector 600, differential inputs, + and − of comparator 602 may be operatively coupled to RxP and RxN, respectively.

At signal detector 600, the threshold may be tuned, during fault detection, via a threshold value control signal, thrsh_cntl <X:0>, provided, for example, by calibration unit 514 of FIG. 5. Tuning during fault detection is discussed in more detail, below.

In one or more embodiments, fault detection may be performed using multiple threshold values. More specifically, in at least one example, signal detector 600, and more specifically, comparator 602, may programmed with a first threshold value for comparing an observed signal to the first threshold value to detect a high positive signal. Further, signal detector 600, and more specifically, comparator 602, may programmed with a second threshold value for comparing an observed signal to the second threshold value to detect a low positive signal. Further, signal detector 600, and more specifically, comparator 602, may programmed with a third threshold value for comparing an observed signal to the third threshold value to detect a negative signal. In this example, for each sample period, if detector output signal det_out includes a low potential signal, a state of the associated observed signal at the sample period may be assigned a low value. Otherwise, if detector output signal det_out includes a high potential signal, the state of the associated observed signal at the sample period may be assigned a high value. Using multiple thresholds for fault detection is discussed in more detail, below. Examples of using multiple thresholds are discussed, below.

Figure 7:
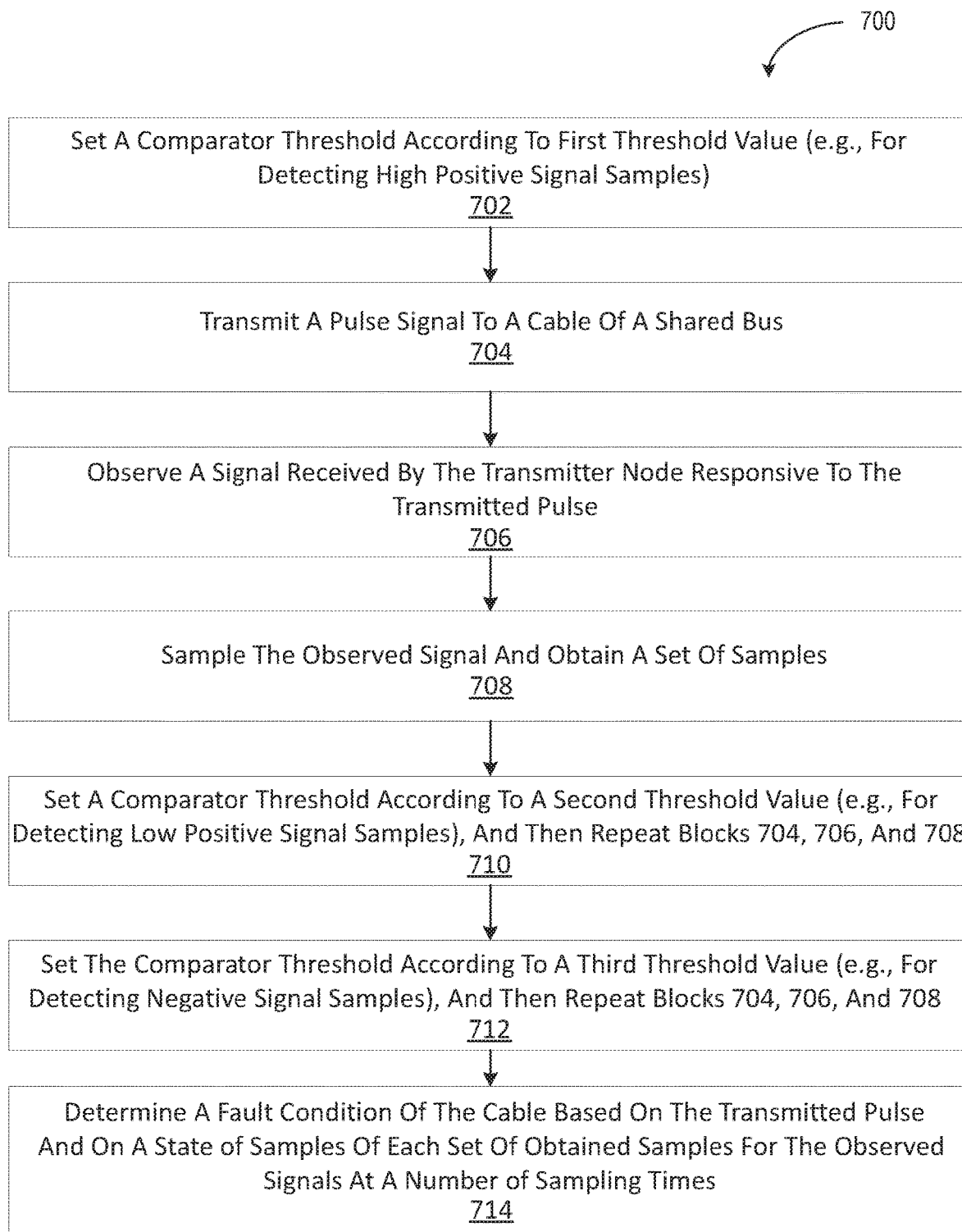
FIG. 7 is a flowchart of an example method of detecting cable faults in a network.

FIG. 7 is a flowchart of an example method 700 of determining a fault condition in a network, such as a 10SPE network. Method 700 may be arranged in accordance with at least one embodiment described in the present disclosure. Method 700 may be performed, in some embodiments, by a device, system, or network, such as network 100 of FIG. 1, node 102 of FIG. 2, PHY 500 of FIG. 5, signal detector 600 of FIG. 6, and/or one or more of the components thereof, or another system or device. In these and other embodiments, method 700 may be performed based on the execution of instructions stored on one or more non-transitory computer-readable media. Although illustrated as discrete blocks, various blocks may be divided into additional blocks, combined into fewer blocks, or eliminated, depending on the desired implementation.

Method 700 may begin at block 702, wherein a comparator threshold is set according to first threshold value (e.g., for detecting high positive signal samples). For example, the first threshold may be set to detect a signal that has an amplitude higher than an amplitude of a pulse signal of block 704.

At block 704, a pulse signal may be transmitted to a cable of a shared bus, and method 700 may proceed to block 704. For example, PHY 106 of FIG. 2 may transmit a pulse (e.g., a 40 nanosecond pulse, a 50 nanosecond pulse, a 60 nanosecond pulse, without limitation) via communication bus 104, which includes the cable.

At block 706, a signal received by at the transmitter node responsive to the transmitted pulse may be observed, and method 700 may proceed to block 706. More specifically, for example, the signal may be observed via one or more signal detectors (e.g., one or more of signal detectors 600 of FIG. 6) of controller 506 of FIG. 5.

At block 708, the observed signal may be sampled and a set of samples obtained, and method 700 may proceed to block 708. For example the signal may be oversampled (e.g., the signal may be sampled every 6 nanoseconds, 8 nanoseconds, 10 nanoseconds, without limitation).

At block 710, the comparator threshold is set according to a second threshold value (e.g., for detecting low positive signal samples), and then blocks 704, 706, and 708 are repeated. For example, the second threshold may be set to detect a signal that has an amplitude greater than zero and less than an amplitude of the pulse signal of block 704.

At block 712, the comparator threshold is set according to a third threshold value (e.g., for detecting negative signal samples), and then blocks 704, 706, and 708 are repeated. For example, the third threshold may be set to detect a signal that has an amplitude less than zero and greater than the negative of the amplitude of the pulse signal of block 704.

After block 712, three sets of samples have been obtained.

At block 714, a fault condition of the cable may be determined based on the transmitted pulse and on a state of samples of each set of obtained samples for the observed signals at a number of sampling times. For example, based on the transmitted pulse and the state of each sample of the observed signal, it may be determined that a fault condition of the cable includes one of an open fault, a closed fault, a mismatch, or no fault.

Notably, instead of programming and re-programming a comparator according to first, second and third threshold values, in another embodiment a signal detector may include three comparators for signal threshold detection, e.g., a first comparator configured to detect a first threshold, a second comparator configured to detect a second threshold, and a third comparator configured to detect a third threshold. In such an embodiment, three sets of samples may be obtained from transmitting one pulsed signal and then processed as described herein.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, method 700 may include comparing each sample of the observed signal to one or more threshold values to determine states of each sample of the observed signal relative to the one or more threshold values. More specifically, method 700 may include comparing each sample of the observed signal to a first threshold value, a second threshold value, and a third threshold value to determine a state of each sample of the observed signal relative to the first threshold value, the second threshold value, and the third threshold value. Further, method 700 may include determining a value for each state of a reflection signal based on the transmitted pulse and the states of each sample of the observed signal relative to the first threshold value, the second threshold value, and the third threshold value.

Various embodiments of the present disclosure may be implemented is 10SPE networks for various applications, such as automotive application, industrial applications, server backplanes, without limitation. Further, various embodiments of the disclosure may be applicable to building, elevators, lighting, industrial in-field, Internet of Things (IOT), without limitation.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. "Based on" means "based, at least in part, on."

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: A method of determining a fault condition of a cable of a shared bus, comprising: transmitting one or more pulse signals from a node to a cable of a shared bus; observing one or more signals received at the node in response to the pulse; sampling the one or more observed signals; and determining a fault condition of the cable based on the one or more transmitted pulses and on an amplitude of each sample of a number of samples of the one or more observed signals.

Embodiment 2: The method according to Embodiment 1, wherein determining the fault condition comprises determining values of one or more reflection signals.

Embodiment 3: The method according to any of Embodiments 1 and 2, wherein determining the value of the reflection signal comprises: comparing an amplitude of each sample of the one or more observed signals to each of a first threshold value, a second threshold value and a third threshold value, wherein the first and second threshold values are positive values, and the first threshold value is greater than the second threshold value, and the third threshold value is negative; and determining the values of the one or more reflection signals based on the comparison of the amplitude of the samples of the one or more observed signals to each of the first threshold value, the second threshold value, and the third threshold value.

Embodiment 4: The method according to any of Embodiments 1 through 3, further comprising: for each of the number of samples of the one or more observed signals: comparing the one or more observed signals to a first threshold value to determine a first value of a sample of the one or more observed signals relative to the first threshold value; comparing the one or more observed signals to a second threshold value to determine a second value of the sample of the one or more observed signals relative to the second threshold value; and comparing the one or more observed signals to a third threshold value to determine a third value of the sample of the one or more observed signals relative to the third threshold value.

Embodiment 5: The method according to any of Embodiments 1 through 4, wherein determining the fault condition of the cable comprising determining the fault condition of the cable based on the first value, second value, and third value of each sample of the one or more observed signals.

Embodiment 6: The method according to any of Embodiments 1 through 5, wherein said sampling is every 10 nanoseconds.

Embodiment 7: A method of detecting a cable fault, comprising: transmitting a first pulse signal from a node to a cable of a shared bus; observing a first signal received at the node in response to the transmitted first pulse signal; determining a state of the observed first signal at each sampling time of a number of sampling times of the observed first signal based on a comparison of the observed first signal at each sampling time to a first threshold value; transmitting a second pulse signal from the node to the cable of the shared bus; observing a second signal received at the node in response to the transmitted second pulse signal; determining a state of the observed second signal at each sampling time of a number of sampling times of the observed second signal based on a comparison of the observed second signal at each sampling time of the number of sampling times of the observed second signal to at a second threshold value; and transmitting a third pulse signal from the node to the cable of the shared bus; observing a third signal received at the node in response to the transmitted third pulse signal; determining a state of the observed third signal at each sampling time of a number of sampling times of the observed third signal based on a comparison of the observed third signal at each sampling time of the number of sampling times of the observed third signal to a third threshold value; and determining a fault condition based on the state of the observed first signal at each sampling time of the number of sampling times of the observed first signal, the state of the observed second signal at each sampling time of the number of sampling times of the observed second signal, and the state of the observed third signal at each sampling time of the number of sampling times of the observed third signal.

Embodiment 8: The method according to Embodiment 7, wherein determining the fault condition comprises determining a state of a reflection signal at each sampling time of the number of sampling times based on the state of the observed first signal at each sampling time of the number of sampling times, the state of the observed second signal at each sampling time of the number of sampling times, and the state of the observed third signal at each sampling time of the number of sampling times.

Embodiment 9: The method according to any of Embodiments 7 and 8, wherein determining the state of the first signal at each sampling time of the number of sampling times comprises comparing the first signal at each sampling time to the first threshold value comprising a first positive value.

Embodiment 10: The method according to any of Embodiments 7 through 9, wherein determining the state of the second signal at each sampling time of the number of sampling times comprises comparing a second signal at each sampling time to the second threshold value comprising a second, lower positive value.

Embodiment 11: The method according to any of Embodiments 7 through 10, wherein determining the state of the third signal at each sampling time of the number of sampling times comprises comparing the third signal at each sampling time to a third threshold value comprising a negative value.

Embodiment 12: A method of detecting a fault in a cable of a network, the method comprising: transmitting a pulse signal from a node to a cable of a shared bus of the network; observing a signal received at the node in response to the pulse; and determining a fault condition of the cable based on the one or more observed signals.

Embodiment 13: The method according to Embodiment 12, wherein determining the fault condition comprises: determining an amplitude a reflection signal based on the pulse and the one or more observed signals; and determining the fault condition based on the reflection signal.

Embodiment 14: The method according to any of Embodiments 12 and 13, further comprising determining a location of a fault condition based on the reflection signal.

Embodiment 15: The method according to any of Embodiments 12 through 14, wherein determining the fault condition comprises one of detecting an open fault condition and a short fault condition.

Embodiment 16: The method according to any of Embodiments 12 through 15, wherein observing the signal generated in response to the pulse comprises observing the signal at a signal detector of a physical layer (PHY) of the network.

Embodiment 17: The method according to any of Embodiments 12 through 16, further comprising at least one of: programming the signal detector with a first threshold value; programming the signal detector with a second threshold value, the second threshold value being a positive value less than the first threshold value; and programming the signal detector with a third threshold value, the third threshold value being less than a negative value.

Embodiment 18: A single-pair Ethernet physical layer (PHY), comprising: a transmitter configured to transmit at least one pulse signal to a cable of a shared bus; a receiver configured to observe at least one second signal received in response to the at least one transmitted pulse signal; and a signal detector configured to: compare an amplitude of each sample of the at least one second signal to at least one threshold value; and generate a detector output signal for each sample of the at least one second signal based on the comparison of the amplitude of each sample of the at least one second signal to the at least one threshold; and fault detection logic coupled to the signal detector and configured to: receive the detector output signal for each sample of the at least one second signal; and determine a fault condition of the cable based on the at least one transmitted pulse signal and on an amplitude of each sample of a number of the samples of the at least one second signal.

Embodiment 19: The PHY according to Embodiment 18, wherein the at least a second signal comprises a second signal, a third signal, and a fourth signal, wherein the signal detector is configured to: compare an amplitude of each sample of the second signal to a first positive threshold value of the at least one threshold value; compare an amplitude of each sample of the third signal to a second, lower positive threshold value of the at least one threshold value; and compare an amplitude of each sample of the fourth signal to a third negative threshold value of the at least one threshold value.

Embodiment 20: The PHY according to any of Embodiments 18 and 19, wherein the fault detection logic is configured to determine the fault condition of the cable based on the at least one transmitted pulse signal, the amplitude of each sample of the second signal compared to the first positive threshold value, the amplitude of each sample of the third signal compared to the second, lower positive threshold value, and the amplitude of each sample of the fourth signal to the third negative threshold value.

Embodiment 21: The PHY according to any of Embodiments 18 through 20, wherein the signal detector comprises one or more comparators.

Embodiment 22: The PHY according to any of Embodiments 18 through 21, wherein the one or more comparators comprise one re-programmable comparator.

Embodiment 23: The PHY according to any of Embodiments 18 through 22, wherein the one or more comparators comprise three comparators.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

We is claimed is:

1. A method of determining a fault condition of a cable of a shared bus, comprising:
   transmitting a pulse signal from a node to a cable of a shared bus;
   observing a signal received at the node in response to the pulse signal;
   sampling the observed signal;
   determining a plurality of values for the observed signal at least partially based on a comparison of an amplitude of each sample of a plurality of samples of the observed signal to each of a first threshold value being between double an amplitude of the pulse signal and the amplitude of the pulse signal, a second threshold value having an amplitude between the amplitude of the pulse signal and zero, and a third threshold value having a negative polarity, the third threshold value being between zero and a negative amplitude of the pulse signal; and
   determining a fault condition of the cable at least partially based on the pulse signal and on the plurality of values.

2. The method of claim 1, wherein determining the plurality of values for each of the observed signal at least partially based on the comparison comprises:
   for each of the plurality of samples of the observed signal:
      comparing the observed signal to the first threshold value to determine a first value of a sample of the observed signal relative to the first threshold value;
      comparing the observed signal to the second threshold value to determine a second value of the sample of the observed signal relative to the second threshold value; and
      comparing the observed signal to the third threshold value to determine a third value of the sample of the observed signal relative to the third threshold value.

3. The method of claim 2, wherein determining the fault condition of the cable comprising determining the fault condition of the cable based on the first value, second value, and third value of each sample of the observed signal.

4. The method of claim 1, wherein the sampling is every 10 nanoseconds.

5. A method of detecting a cable fault, comprising:
   transmitting a first pulse signal from a node to a cable of a shared bus;
   observing a first signal received at the node in response to the transmitted first pulse signal;
   determining a state of the observed first signal at each sampling time of a plurality of sampling times of the observed first signal at least partially based on a comparison of the observed first signal at each sampling time of the plurality of sampling times to a first threshold value being positive and between double an amplitude of the first pulse signal and the amplitude of the first pulse signal;
   transmitting a second pulse signal from the node to the cable of the shared bus;
   observing a second signal received at the node in response to the transmitted second pulse signal;
   determining a state of the observed second signal at each sampling time of a plurality of sampling times of the observed second signal at least partially based on a comparison of the observed second signal at each sampling time of the plurality of sampling times of the observed second signal to at a second threshold value having a positive value and an amplitude between an amplitude of the second pulse signal and zero;
   transmitting a third pulse signal from the node to the cable of the shared bus;
   observing a third signal received at the node in response to the transmitted third pulse signal;
   determining a state of the observed third signal at each sampling time of a plurality of sampling times of the observed third signal at least partially based on a comparison of the observed third signal at each sampling time of the plurality of sampling times of the observed third signal to a third threshold value being between zero and a negative amplitude of the third pulse signal; and
   determining a fault condition at least partially based on the state of the observed first signal at each sampling time of the plurality of sampling times of the observed first signal, the state of the observed second signal at each sampling time of the plurality of sampling times of the observed second signal, and the state of the observed third signal at each sampling time of the plurality of sampling times of the observed third signal.

6. The method of claim 5, wherein determining the fault condition comprises determining a state of a reflection signal at each sampling time of the plurality of sampling times based on the state of the observed first signal at each sampling time of the plurality of sampling times, the state of the observed second signal at each sampling time of the plurality of sampling times, and the state of the observed third signal at each sampling time of the plurality of sampling times.

7. A method of detecting a fault in a cable of a network, the method comprising:
    transmitting a plurality of pulse signals from a node to a cable of a shared bus of the network;
    observing a number of signals received at the node in response to the plurality of pulse signals;
    determining a plurality of values for each of the number of observed signals at least partially based on a comparison of an amplitude of each sample of a plurality of samples of each of the number of observed signals to each of a first threshold value, a second threshold value, and a third threshold value, the first threshold value greater than an amplitude of a pulse signal of the plurality of pulse signals, the second threshold value having a positive value and an amplitude between the amplitude of the pulse signal and zero; and
    determining a fault condition of the cable at least partially based on the number of observed signals.

8. The method of claim 7, wherein determining the fault condition comprises:
    determining an amplitude of a reflection signal at least partially based on the plurality of pulse signals and the number of observed signals; and
    determining the fault condition at least partially based on the reflection signal.

9. The method of claim 8, further comprising determining a location of a fault condition based on the reflection signal.

10. The method of claim 7, wherein determining the fault condition comprises one of detecting an open fault condition and a short fault condition.

11. The method of claim 7, wherein observing the number of signals received at the node comprises observing the number of signals at a signal detector of a physical layer (PHY) of the network.

12. The method of claim 11, further comprising at least one of:
    programming the signal detector with the first threshold value being between double the amplitude of the pulse signal and the amplitude of the pulse signal;
    programming the signal detector with the second threshold value being a positive value less than the amplitude of the pulse signal; and
    programming the signal detector with the third threshold value being a negative value greater than a negative amplitude of the pulse signal.

13. A single-pair Ethernet physical layer (PHY), comprising:
    a transmitter configured to transmit a plurality of pulse signals to a cable of a shared bus;
    a receiver configured to observe a number of second signals received in response to the plurality of transmitted pulse signals; and
    a signal detector configured to:
        compare an amplitude of each sample of a plurality of samples of each of the number of second signals to at least three threshold values, the at least three threshold values including: a first positive threshold value greater than an amplitude of each of the plurality of pulse signals; and a second, lower positive threshold value between the amplitude of each of the plurality of pulse signals and zero volts; and
        generate a detector output signal for each sample of the plurality of samples of each of the number of second signals at least partially based on the comparison of the amplitude of each sample of the plurality of samples of each of the number of second signals to the at least three threshold values; and
    fault detection logic coupled to the signal detector and configured to:
        receive the detector output signal for each sample of the plurality of samples of each of the number of second signals; and
        determine a fault condition of the cable at least partially based on the plurality of transmitted pulse signals and on the detector output signals.

14. The PHY of claim 13, wherein the signal detector is configured to:
    compare an amplitude of each sample of the plurality of samples of each of the number of signals to the first positive threshold value of the at least three threshold values, the first positive threshold value between double the amplitude of each of the plurality of pulse signals and the amplitude of each of the plurality of pulse signals;
    compare an amplitude of each sample of a plurality of samples of each of the number of signals to the second, lower positive threshold value of the at least three threshold values; and
    compare an amplitude of each sample of a plurality of samples of each of the number of signals to a third negative threshold value of the at least three threshold values, the third negative threshold value between zero volts and a negative amplitude of each of the plurality of pulse signals.

15. The PHY of claim 14, wherein the fault detection logic is configured to determine the fault condition of the cable based on the plurality of transmitted pulse signals, the amplitude of each sample of the plurality of samples of each of the number of signals compared to the first positive threshold value, the second, lower positive threshold value, and the third negative threshold value.

16. The PHY of claim 13, wherein the signal detector comprises one or more comparators.

17. The PHY of claim 16, wherein the one or more comparators comprise one or more re-programmable comparators.

18. The PHY of claim 16, wherein the one or more comparators comprise three comparators.

* * * * *

UNITED STATES PATENT AND TRADEMARK OFFICE
CERTIFICATE OF CORRECTION

PATENT NO. : 11,121,782 B2
APPLICATION NO. : 16/588714
DATED : September 14, 2021
INVENTOR(S) : John Junling Zang et al.

Page 1 of 1

It is certified that error appears in the above-identified patent and that said Letters Patent is hereby corrected as shown below:

In the Specification
Column 6, Line 15, change "anode 112" to --a node 112--

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*